United States Patent
Refai-Ahmed et al.

(10) Patent No.: US 7,283,364 B2
(45) Date of Patent: Oct. 16, 2007

(54) THERMAL MANAGEMENT APPARATUS

(75) Inventors: Gamal Refai-Ahmed, Markham (CA); Xiaohua H. Sun, Cupertino, CA (US); Nima Osqueizadeh, Richmond Hill (CA); Salim Lakhani, Toronto (CA); Jim E. Loro, San Martin, CA (US); A. Mei Lan Shepherd-Murray, Keswick (CA); Ross Lau, Toronto (CA)

(73) Assignee: ATI Technologies Inc., Markham, Ontario (CA)

( * ) Notice: Subject to any disclaimer, the term of this patent is extended or adjusted under 35 U.S.C. 154(b) by 217 days.

(21) Appl. No.: 10/999,269

(22) Filed: Nov. 29, 2004

(65) Prior Publication Data

US 2006/0114657 A1 Jun. 1, 2006

(51) Int. Cl.
*H05K 7/20* (2006.01)
*H01L 23/34* (2006.01)

(52) U.S. Cl. ............... 361/719; 361/690; 361/695; 361/704; 165/80.3; 165/185; 257/719

(58) Field of Classification Search ........... 361/687, 361/690, 694–697, 703–705, 709–711, 714, 361/717–719, 720; 174/35 R, 35 MS, 35 GC, 174/16.3; 165/80.2, 80.3, 185; 257/706–727
See application file for complete search history.

(56) References Cited

U.S. PATENT DOCUMENTS

| | | | |
|---|---|---|---|
| 5,662,163 A | | 9/1997 | Mira |
| 5,880,930 A | * | 3/1999 | Wheaton .............. 361/690 |
| 6,356,446 B1 | | 3/2002 | Guerrero |
| 6,452,797 B1 | * | 9/2002 | Konstad .............. 361/695 |
| 6,545,879 B1 | * | 4/2003 | Goodwin ............. 361/807 |
| 6,671,177 B1 | * | 12/2003 | Han ................... 361/719 |
| 6,717,811 B2 | * | 4/2004 | Lo et al. ............. 361/698 |
| 6,723,917 B1 | * | 4/2004 | Wang ................. 174/383 |
| 6,859,367 B2 | * | 2/2005 | Davison .............. 361/704 |
| 6,947,284 B2 | * | 9/2005 | Liu ................... 361/704 |
| 7,002,797 B1 | * | 2/2006 | Wittig ................ 361/695 |

OTHER PUBLICATIONS

Photo of ATI graphics card with heat synch (top and bottom view).

* cited by examiner

*Primary Examiner*—Michael Datskovskiy
(74) *Attorney, Agent, or Firm*—Vedder, Price, Kaufman & Kammholz, P.C.

(57) ABSTRACT

The present disclosure relates to a thermal management apparatus used to manage temperature of components mounted to a circuit substrate, such as electronic or optical components. The apparatus includes a heat dissipation structure that includes at least one protrusion extending from a surface of the heat dissipation structure. A carrier structure is also included and engages with the heat dissipation structure. The carrier structure includes an aperture that receives the at least one protrusion. Additionally, the apparatus includes at least one biasing structure that is configured to allow movement of the heat dissipation structure relative to the carrier structure and provides a biasing force tending to move the heat dissipation structure and carrier structure together.

13 Claims, 11 Drawing Sheets

-PRIOR ART-

-PRIOR ART-

*-PRIOR ART-*

THERMAL MANAGEMENT APPARATUS

FIELD OF THE INVENTION

The present disclosure relates to a thermal management apparatus and, more particularly, an apparatus for thermal management of components mounted to a circuit board.

BACKGROUND OF THE INVENTION

In electrical circuits, such as electronic or optical components, the operation of these components generates heat due to their consumption of power. Such heat, however, is detrimental to many electrical components such as integrated circuits or optical devices. Accordingly, these components typically require cooling beyond mere air convention or ventilation with a fan, for example. In order to accomplish additional cooling, it is known to use heat sink devices that remove heat through thermal conduction in the heat sink device. Typically, these heat sink devices physically contact with components on a substrate such as a circuit board and are constructed of a thermally conductive material, such as metal (e.g., copper or aluminum). Additionally, heat sink devices typically feature a construction having a plurality of fins allowing air movement over a large surface area of the heat sink in order to remove heat through ventilation or natural air convection.

FIG. 1 illustrates a circuit assembly 100, such as a circuit board configured to connect to a PCI or PCI Express, or AGP bus. In particular, the assembly 100 shown in FIG. 1 is a graphics card that is insertable into a PCI Express or AGP bus slot in order to interface with a computing system. The circuit assembly 100 includes a thermal cooling apparatus 102 that is used to effect cooling of components on a circuit substrate 104. The thermal cooling apparatus 102 includes a heat sink structure 106 and air mover, such as a fan 108 that causes air movement or ventilation over fins 110 of the heat sink structure 106. In this example, the heat sink structure 106 within the thermal cooling apparatus 102 is positioned such that it physically contacts components 112 mounted on the circuit substrate 104. In particular, components, such as processing devices, generate more heat than other components, such as memory devices. In this example, a graphics processor chip 114 is illustrated. In order to effect optimal cooling of the graphics processor chip 114, it is known that heat sink structures, such as heat sink 106, must be engaged with the processor 114 with a particular force per unit area (i.e., pressure). As an example, a graphics processing unit requires around 40 pounds per square inch (psi) pressure of the heat sink structure 106 on the processor 114 in order to achieve optimal heat transfer and, thus, cooling of the processor 114. In contrast, devices such as the memory devices 116 only require a pressure around three (3) pounds per square inch (psi) to effect optimal cooling. If more pressure is exerted on components such as the memory devices 116, excessive stress will cause cracking and degradation of these types of devices 116.

FIG. 2 illustrates the back side of the circuit board 104 of the circuit board assembly 100, which is opposite from the top perspective view shown in FIG. 1. This figure illustrates the use of a spring clip 200 that exerts the requisite pressure of the heat sink structure 106 onto either the processor 114 or memory devices 116. The biasing assembly 200 includes a spring bracket 202 that is attached to the thermal cooling apparatus 102 by a pin 204 passing through the circuit substrate 104 or other suitable device. The spring bracket 202 is rotatable around the pin 204 and the pin passes through the circuit substrate 104 to connect the spring bracket 202 to the thermal cooling apparatus 102. The spring bracket 202 also includes a plurality of apertures 206, each of the apertures 206 having a wide portion 208 and a slot portion 210 in order to introduce biasing or force to cause the heat sink structure 106 to put pressure on the processor 114 or memory devices 116. The wide portions 208 of the spring bracket 202 are configured to engage with a plurality of fixed ends 212 affixed to the circuit board 104. The spring bracket 202 is configured such that, when rotated around the pin 204, the slot portions 210 of the apertures 206 engage the fixed pins 212, and pressure is introduced due to the biasing or spring nature of the spring bracket 202. Thus, the heat sink structure 106 is then pressurably engaged with either the processor 114 or the memory devices 116 in order to effect better thermal management of these devices.

In most constructions of circuit assemblies, components, however, have differing heights relative to the surface of the circuit substrates or PCB boards. As an example of such construction, FIG. 3 illustrates a partial sectional elevation view of the circuit assembly illustrated in FIG. 1. As shown, the thermal cooling apparatus 102 featuring heat sink structure 106 is mounted on top of the circuit substrate 104 over a processor 114 and a memory device 116, as examples. The height of the processor (indicated as $H_1$) is significantly greater than a height $H_2$ of the memory device 116. For example, in a graphics processing board, a graphics processing unit can have a height of around 2 millimeters to 2.7 millimeters, whereas memory devices used in such circuits are around 1.1 millimeters in height. Thus, when using a single biasing structure (e.g., spring 202 pin 204, and posts 212), This difference in height leads to either too little pressure on the processing devices such as processor 114 or too much pressure on components such as memory devices 116. In order to compensate for the height difference and alleviate pressure on memory devices 115, for example, an additional plate 302 is included to compensate for the height difference and also to mitigate or reduce pressure exerted on the memory device 115. This use of a plate 302, however, is nonetheless insufficient to prevent eventual stress on the components. Additionally, known thermal cooling apparatus, such as thermal cooling apparatus 102, exhibit intolerance to transportation, shock and vibration due to a rigid fixation of the thermal management device to the circuit substrate.

BRIEF DESCRIPTION OF THE DRAWINGS

The present disclosure will be more readily understood in view of the following description when accompanied by the figures described below and where like reference numerals represent like elements.

DETAILED DESCRIPTION OF THE PRESENT EMBODIMENTS

The present disclosure relates to a thermal management apparatus used to manage the temperature of components, such as electronic or optical components. The apparatus includes a heat dissipation structure that includes at least one protrusion extending from a surface of the heat dissipation structure. A carrier structure is also included and configured to engage with the heat dissipation structure. The carrier structure includes an aperture configured to receive the at least one protrusion. Additionally, the apparatus includes at least one biasing structure that is configured to allow movement of the heat dissipation structure relative to the carrier structure and provides a biasing force tending to move the heat dissipation structure and carrier structure together.

The disclosed thermal management device is employable on a circuit substrate including various electrical components having disparate heights. Specifically, by providing a heat dissipation structure with a protrusion and a corresponding carrier structure with an aperture receiving the protrusion, the heat dissipation structure can be engaged with a surface to be thermally managed at a desired pressure applied by the biasing structure, as well as thereby accommodating the particular height of the surface relative to another surface such as a circuit substrate. The employed biasing structure also permits movement of the heat dissipation structure relative to the carrier structure thereby providing a moveable or "floating" heat dissipation structure.

Figure 1:
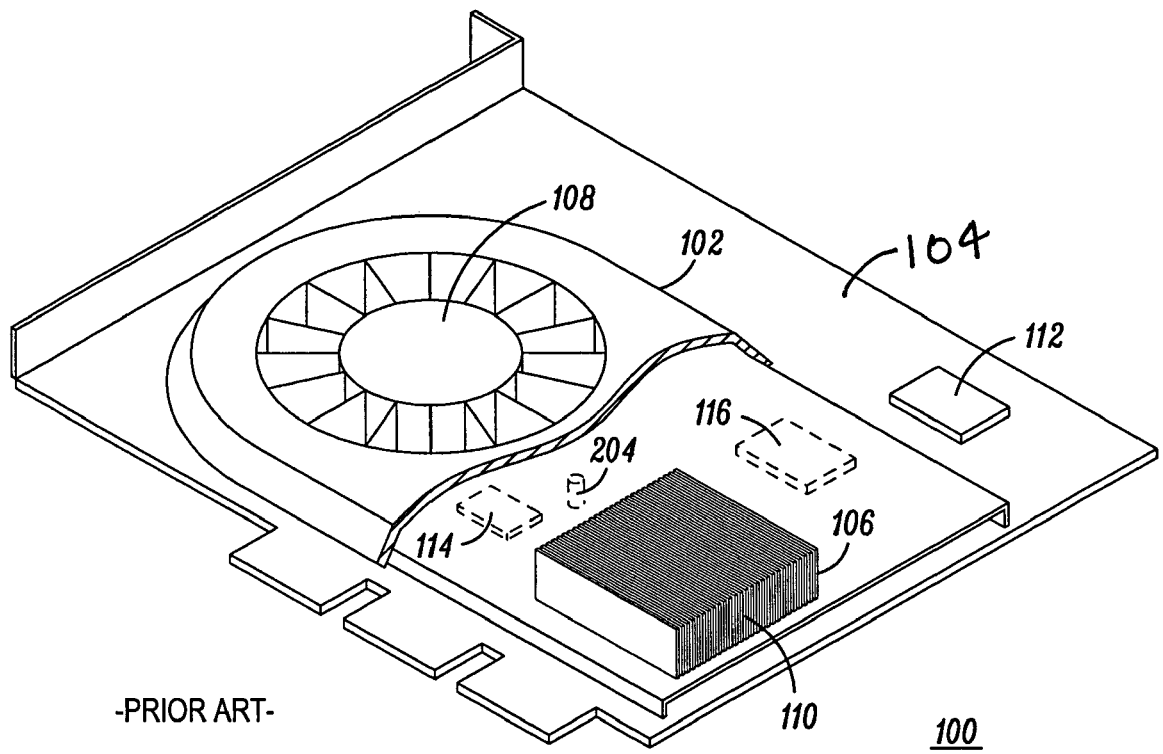
FIG. 1 illustrates a top perspective view of a circuit assembly including a thermal cooling apparatus.
Figure 2:
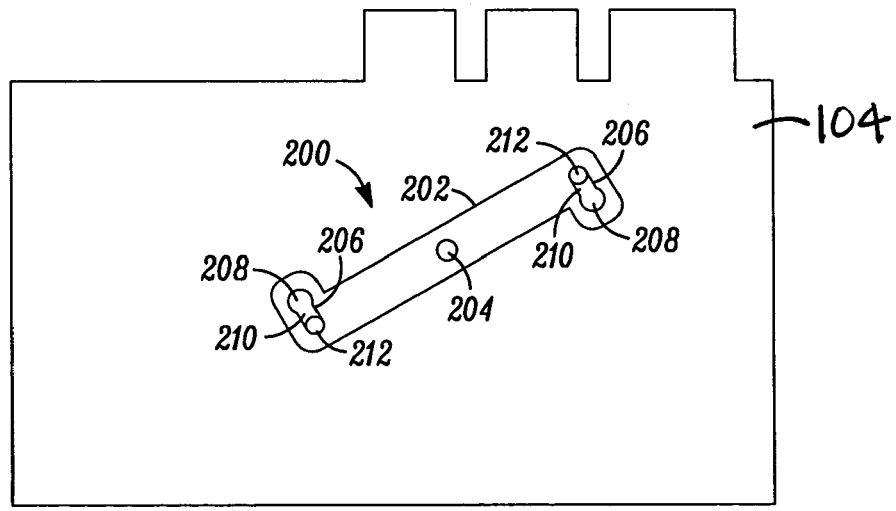
FIG. 2 illustrates a plan view of the bottom portion of the circuit assembly of FIG. 1.
Figure 3:
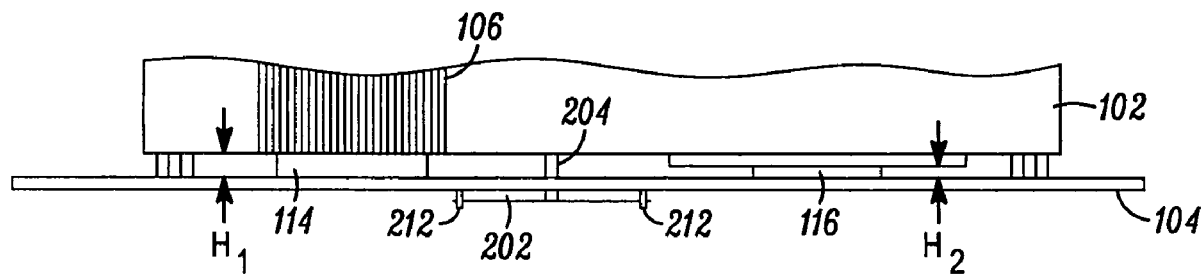
FIG. 3 illustrates a partial sectional elevation view of the circuit assembly illustrated in FIG. 1.
Figure 4:
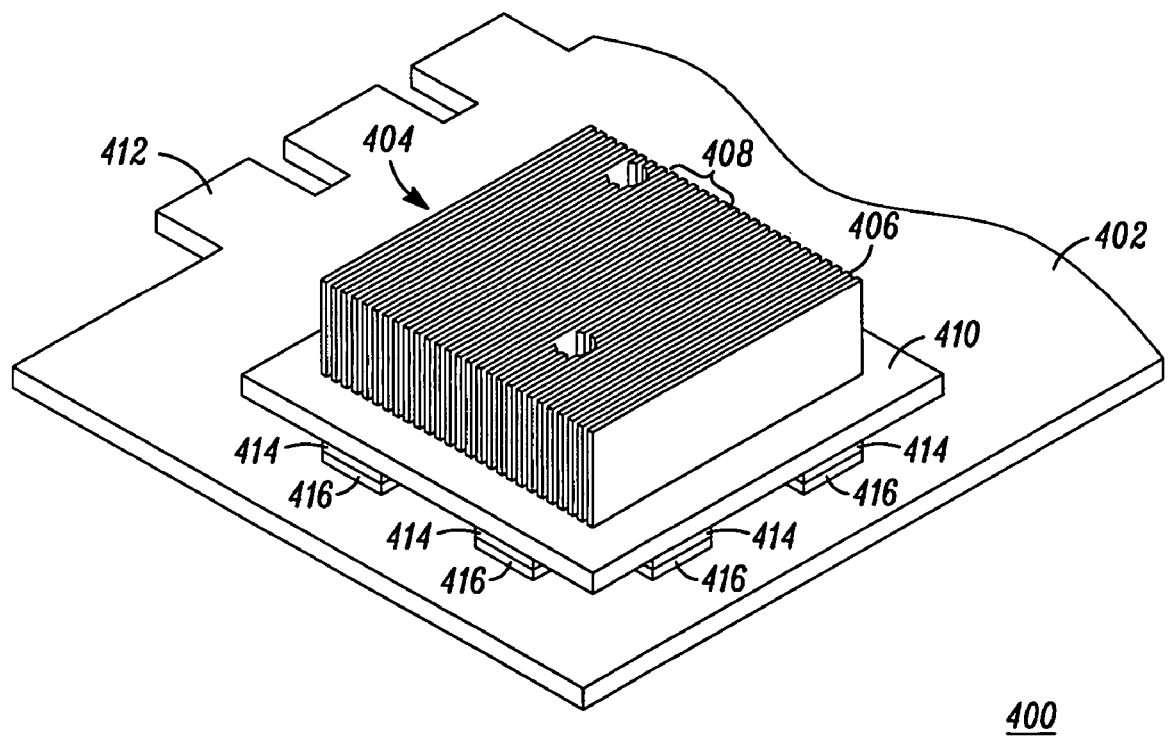
FIG. 4 illustrates a top perspective view of one example of part of a circuit assembly employing a thermal management device according to the present disclosure.

FIG. 4 illustrates a partial perspective view of a circuit assembly 400 including a circuit board or substrate 402, which may include a number of various electrical components, such as electronic and optical components including processor devices and memory devices. The assembly 400 also includes a thermal management apparatus 404 that may be used to effect the thermal management (such as cooling or heating) of components on the circuit substrate 402. The thermal management apparatus 404 includes a heat dissipation structure 406, which may be a heat sink constructed of a thermally conductive material such as copper, aluminum, graphite, magnesium, any combination of these materials or any other suitable material. As shown, the structure 406 includes a plurality of fins 408 to effect heat dissipation. The thermal management apparatus 404 also includes a carrier structure 410 that is engageable with the heat dissipation structure 406. The carrier structure 410 is also constructed of a thermally conductive material, such as aluminum, copper, graphite, magnesium or any other suitable material. In an example where the thermal management apparatus 404 is used with a plug-in type circuit board that plugs into a slot or other structure, a lighter material such as aluminum may be better suited for use with such circuit boards due to the lower weight of aluminum. Lower weight of the thermal management apparatus 404 reduces stress on the plug-in connections of the circuit board such as board connections 412 illustrated in FIG. 4. Materials such as graphite and magnesium, for example, yield a lower weight thermal management apparatus 404 that serves to minimize the stress of the apparatus on the circuit substrate and the components being thermally managed.

The carrier structure 410 also may include carrier protrusions 414 that engage with components 416 mounted on the circuit substrate 402. These carrier protrusions 414 serve to effect thermal management of the particular components 416 with which they engage. Also, the carrier structure may be affixed to the circuit substrate 402 in such a way to effect a predetermined pressure of the carrier protrusions 414 onto the components 416. In an example, the pressure exerted by the carrier structure 410 at the protrusions is significantly less than the pressure exerted by heat dissipation structure 406 on components with which it contacts.

Figure 5:
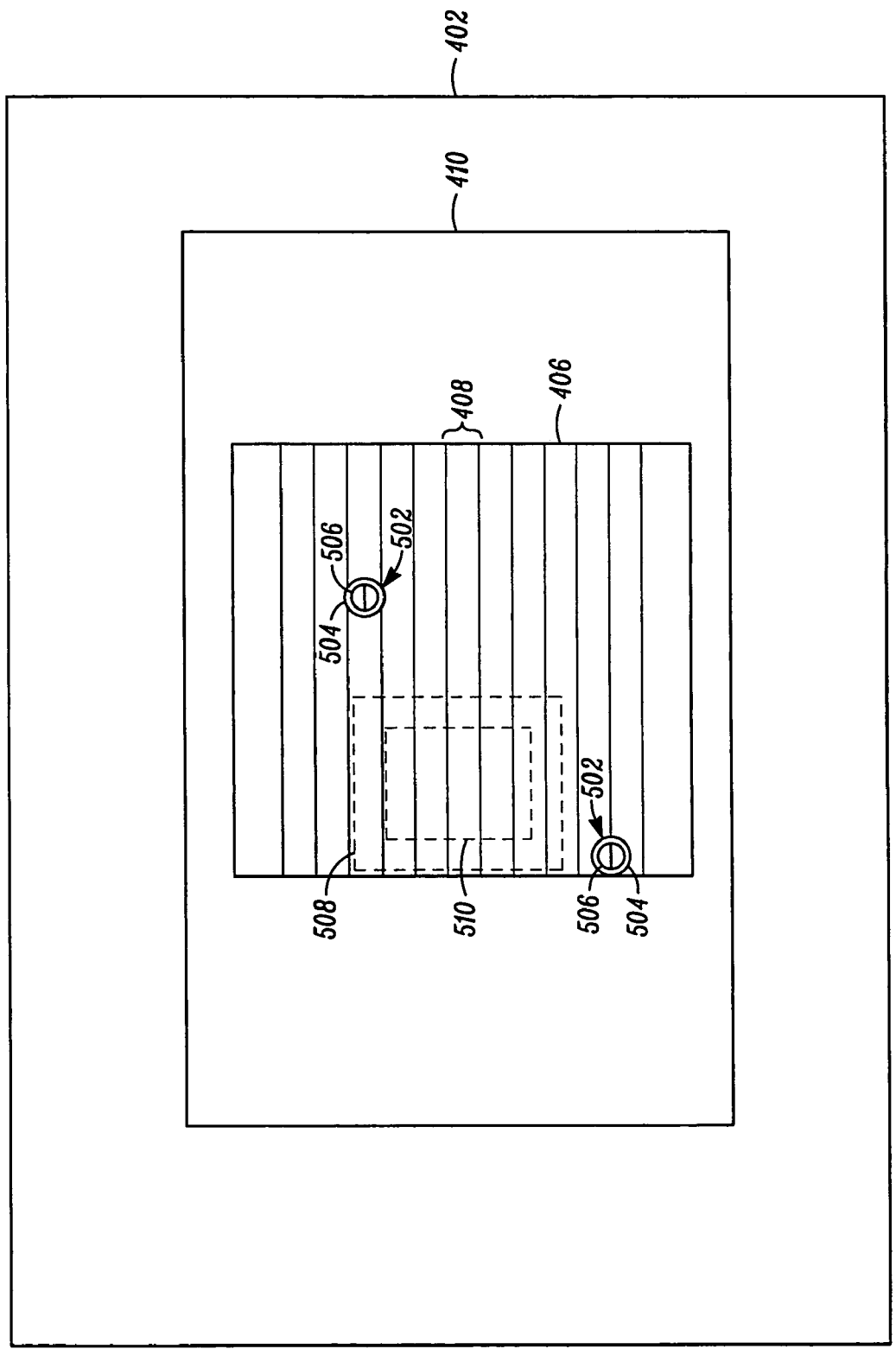
FIG. 5 illustrates one example of a top plan view of the assembly of FIG. 4.

FIG. 5 illustrates an example of a plan view of the circuit board assembly 400 illustrated in FIG. 4. As shown, the heat dissipation structure 406 includes one or more biasing structures 502, the structure of which will be explained more fully with respect to FIGS. 10–13. As may be seen in the top plan elevation view of FIG. 5, the biasing structures 502 include an aperture 504 where the fins 408 of the dissipation structure 406 are cut away or absent. The biasing structures 502 also include a shaft or pin 506 that is, in part, used to secure the heat dissipation structure 406 to the carrier 410. In an example, the pin 506 is a screw having a cap at one end and threads at another end that engage with threads set in the carrier structure 410.

Also shown dashed in the top plan view of FIG. 5 is an aperture 508 in the carrier structure 410. Additionally, a protrusion 510 that extends from the bottom of the heat dissipation structure 406 is illustrated by dashed lines. The protrusion 510 extends from a bottom surface of the heat dissipation structure 406 into the aperture 508 of the carrier structure 410.

Figure 6:
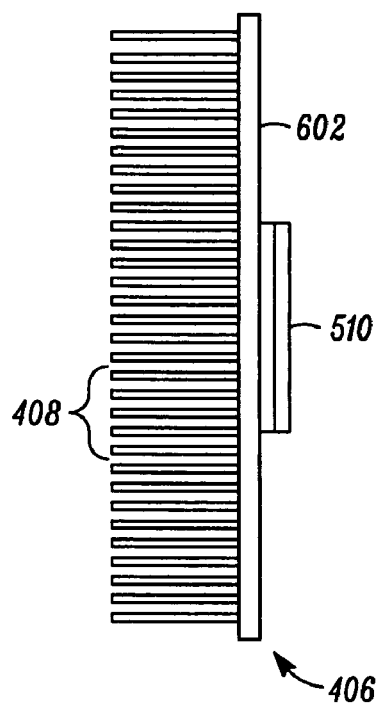
FIG. 6 illustrates one example of a side elevation view of a heat dissipation structure used in the assembly of FIG. 4.

FIG. 6 illustrates a side elevation view of an exemplary heat dissipation structure 406 to show the protrusion 510. As shown, the protrusion 510 extends from the bottom surface 602 of the heat dissipation structure 406.

Figure 7:
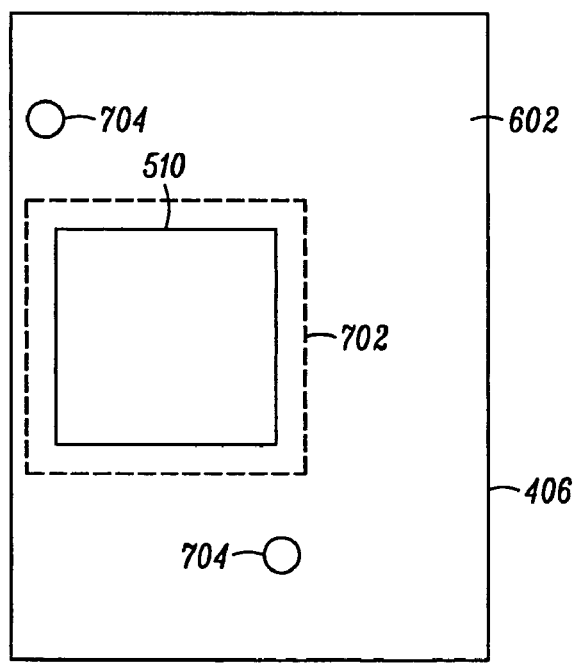
FIG. 7 illustrates one example of a bottom plan view of the heat dissipation structure of FIG. 6.

FIG. 7 illustrates a bottom plan view of the heat dissipation structure 406. As shown, the protrusion 510 is disposed on the bottom surface 602 of the heat dissipation structure 406. Although the shape of the protrusion 510 is a square island, the shape of the protrusion 510 may be configured in any suitable manner and located at any suitable spot. In one example, the shape of the protrusion 510 may be configured to match the shape of whatever component the protrusion 510 will contact in order to effect thermal management. Additionally, the heat dissipation structure 406 may include a stepped border 702 shown dashed to indicate that this is an alternative feature. In particular, the stepped border 702 may be larger than the protrusion 510 and shaped to match the aperture 508 in the carrier structure 410 for example. In particular, this stepped border 702 may be included and configured in conjunction with the same sized aperture in the carrier structure to completely cover a correspondingly configured border around a component on the circuit board. Such borders are known for components such as processing units and other components that exude higher heat output. It is noted that the protrusion 510 may be either an attached piece to the heat dissipation structure 406 or can be milled or integrally molded as part of a larger piece (e.g., the heat dissipation structure).

Figure 8:
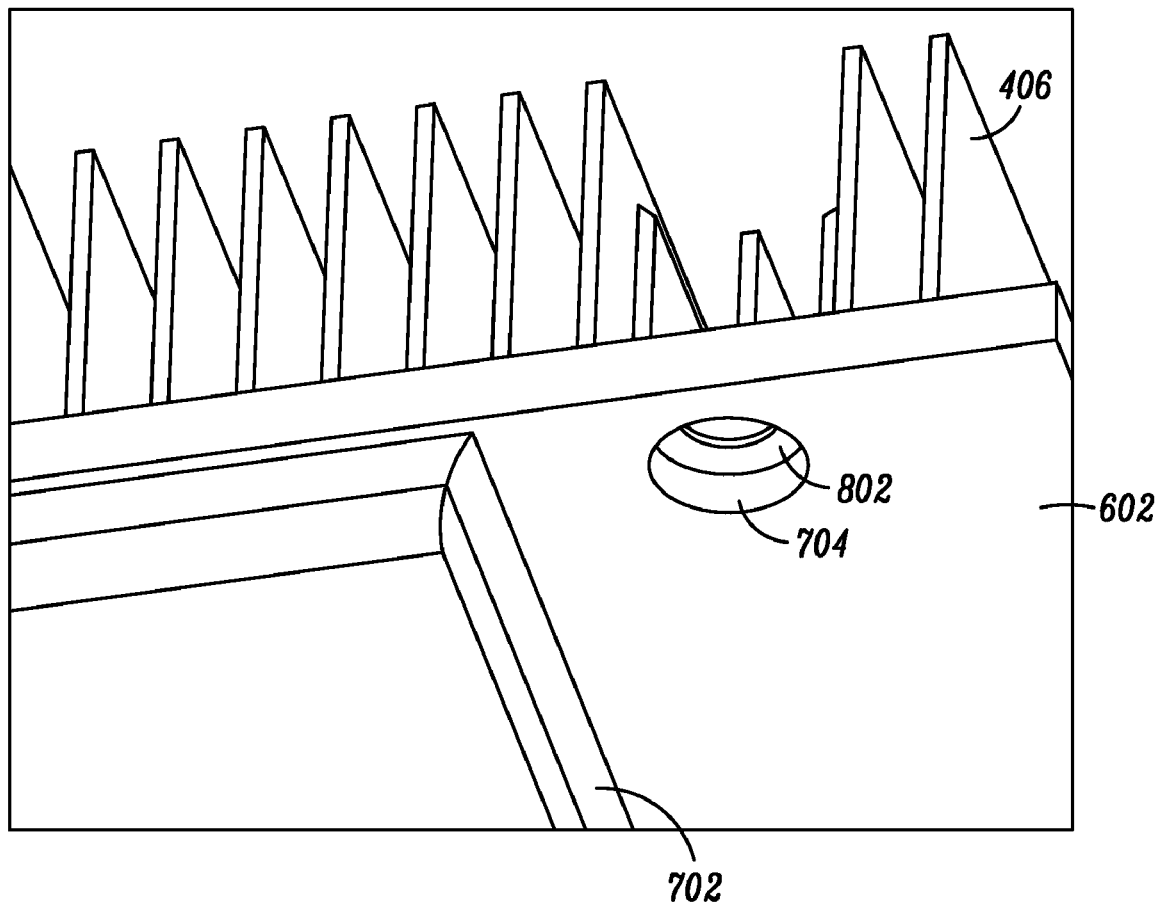
FIG. 8 illustrates a bottom perspective view of one example of a portion of the heat dissipation structure of FIG. 7.

FIG. 7 also illustrates apertures or holes 704 formed in the bottom surface 602, through which the pin or shaft 506 may pass. Also included is a counterbore 802 as, illustrated in the perspective view in FIG. 8. This counterbore 802 is configured to mate with a nipple on the carrier structure as will be discussed with respect to FIGS. 9 and 10.

Figure 9:
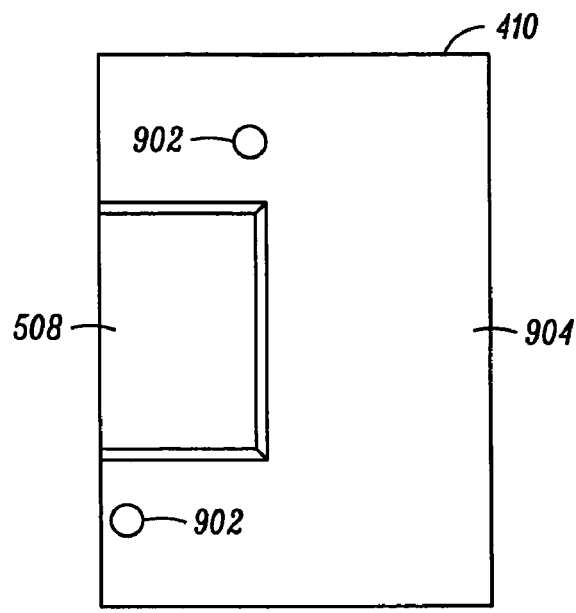
FIG. 9 illustrates a partial plan view of one example of a carrier structure that may be used with the assembly illustrated in FIG. 4.
Figure 10:
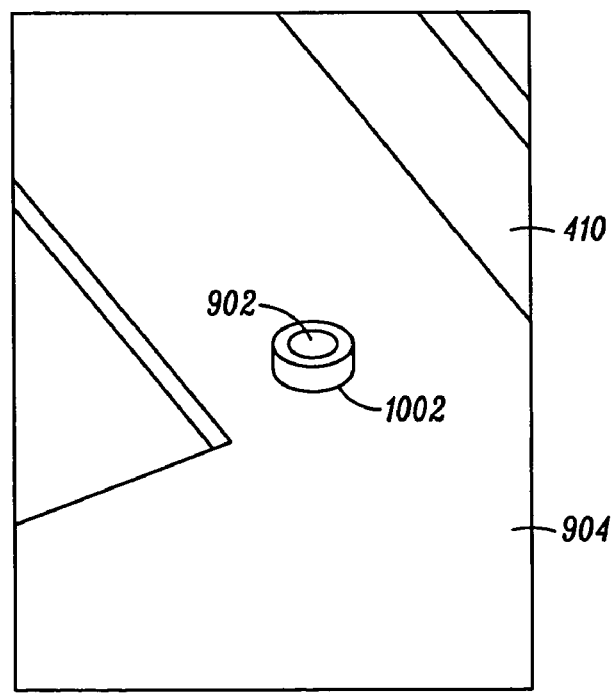
FIG. 10 illustrates a top perspective view of one example of a portion of the carrier structure of FIG. 9.

As shown in FIG. 9, a top plan view of the carrier structure 410 is illustrated. Within the carrier structure 410 is the aperture 508 configured to receive the protrusion 510 of the heat dissipation structure 406. Additionally, the carrier structure 410 includes one or more apertures 902, which receive and secure the pin 506. In an example, the holes 902 include threading that engage with threads on the end of the pin 506. The holes 902 may also include a raised nipple 1002 extending from the upper surface 904 of the carrier structure 410 as illustrated in FIG. 10. The nipple 1002 has a diameter slightly smaller than the counterbore 802 shown in FIG. 8 such that the nipple engages with the counterbore when the heat dissipation structure 406 is engaged with the carrier structure 410. The use of the nipple 1002 and counterbore 802 ensures that the heat dissipation structure 406 and the carrier structure 410 align properly during engagement and ensures that there is no lateral movement or "play" of the heat dissipation structure 406 with respect to the carrier structure 410.

Figure 11:
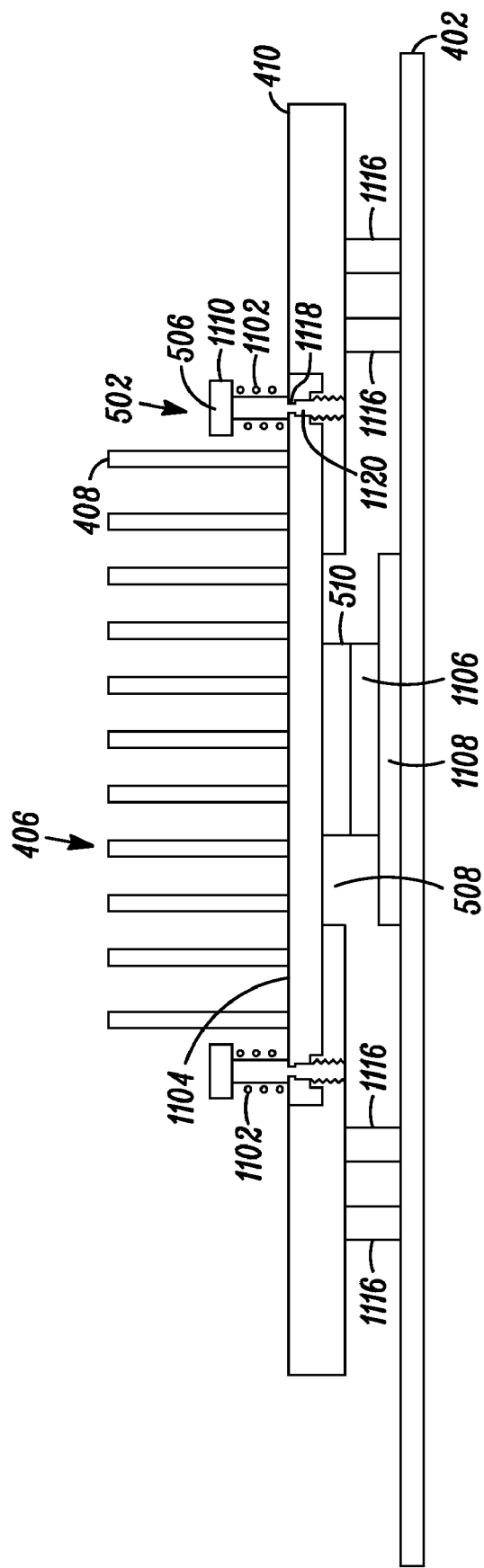
FIG. 11 illustrates a cutaway elevation view of one example of the assembly of FIG. 4.

FIG. 11 illustrates a sectional elevation view of the circuit assembly of FIG. 4, for example. In this example, the heat dissipation structure 406 is engaged with the carrier structure 410 and secured through the biasing structures 502. The protrusion 510, as shown, engages with a component 1106 mounted to the circuit substrate 402. Each of the biasing structures 502 further includes a biasing force device 1102 that is disposed between the upper surface 1104 of the heat dissipation structure 406 and a cap 1110 at one end of the pin or shaft 506. The pin 506, if configured as a screw, includes a slot 1112 enabling rotation of the screw threads at the opposing end of the shaft 506 with threads 1114 in the hole 902 within the carrier structure 410. The biasing force device 1102 may be a spring, as shown in FIG. 11, in order to provide the biasing force tending to force the heat dissipation device 406 toward the carrier structure 410 and, thus, forcing the island protrusion 510 onto the component 1106 to be thermally managed at a particular pressure (e.g., 40 psi). It is noted that the biasing force device 1102 may comprise any suitable structure that effects a force, such as a rubber bushing, a leaf spring, or any other suitable structure. Moreover, it is noted that the biasing structure 502 itself may be solely comprised of a spring. For example, it may be constructed such that the spring may effect the biasing force while at the same time securing to the carrier structure 410 through a suitable structure, by glue or any other suitable mechanism.

FIG. 11 also illustrates that in one example, the carrier structure 410 includes footings 1116 that attach the carrier structure 410 to the circuit substrate 402 as well as effect spacing between the carrier structure 410 and substrate 402. Additionally, a border 1108 disposed around the processor 1106 is illustrated according to a particular example. As also shown, the aperture 508 is sized such that it corresponds to the same size and shape as the border 1108, as one example.

Figure 12:
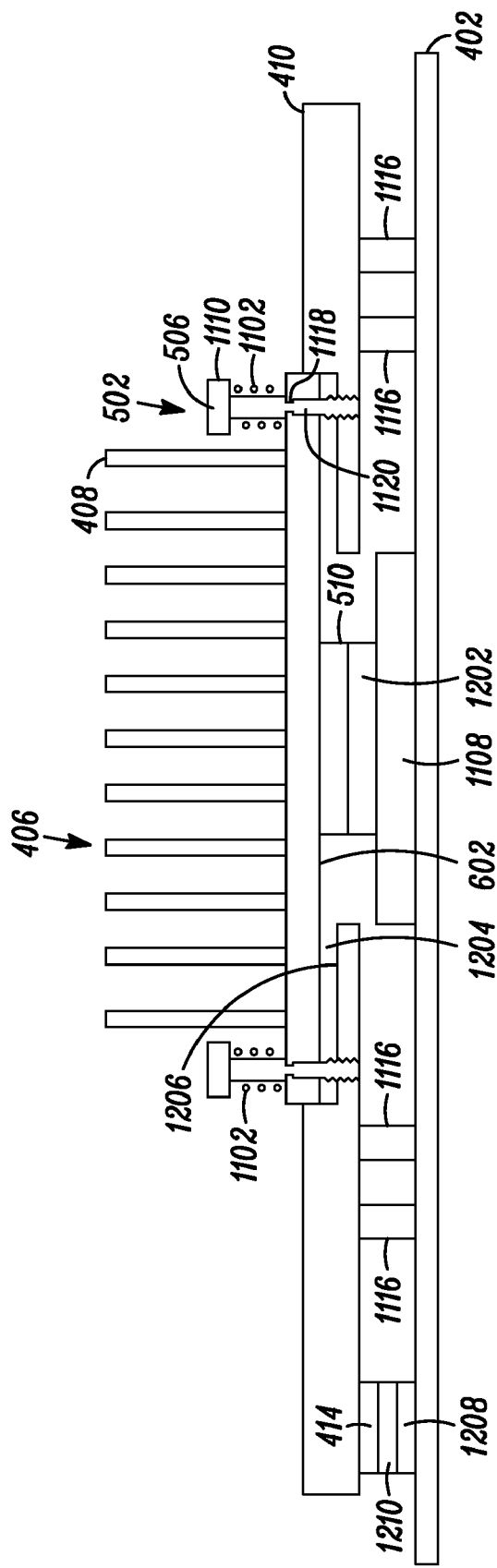
FIG. 12 illustrates a cutaway elevation view of another example of the assembly of FIG. 4.

FIG. 12 illustrates another example of an elevation sectional view of the assembly illustrated in FIG. 4. In the example of FIG. 12, a processor 1202 is shown having a height, which is greater than that shown in FIG. 11. Accordingly, the heat dissipation structure 406 is vertically displaced causing a gap 1204 between the bottom surface 602 of the top surface 1206 of the carrier structure 410. Accordingly, this figure illustrates how the disclosed thermal management device accommodates components having differing heights. The elasticity of the biasing structure 506 is selected such that the force applied by the protrusion 510 on the component 1202 is the same for different heights in order to ensure optimal cooling over a various height tolerance range.

FIG. 12 also illustrates that the carrier structure 410 is further configured with the carrier protrusions 414 that effect cooling of other components such as a memory device 1208 mounted to the circuit substrate 402. Interposed between the protrusion 414 and the memory device 1208 is a soft, thermal interface material 1210, which may be used to absorb shock and also minimize or diminish the pressure effected by the pad 414 onto the memory device 1208 or any other device requiring less pressure to achieve desired cooling. Although the figure illustrates an interface material 1210, the protrusions 414 may be configured to directly touch the memory device 1208. It is further noted that thermal grease or gel may be interposed between the protrusion 510 of the thermal dissipation structure 406 and the component 1202 to effect better thermal conductance of heat.

Figure 13:
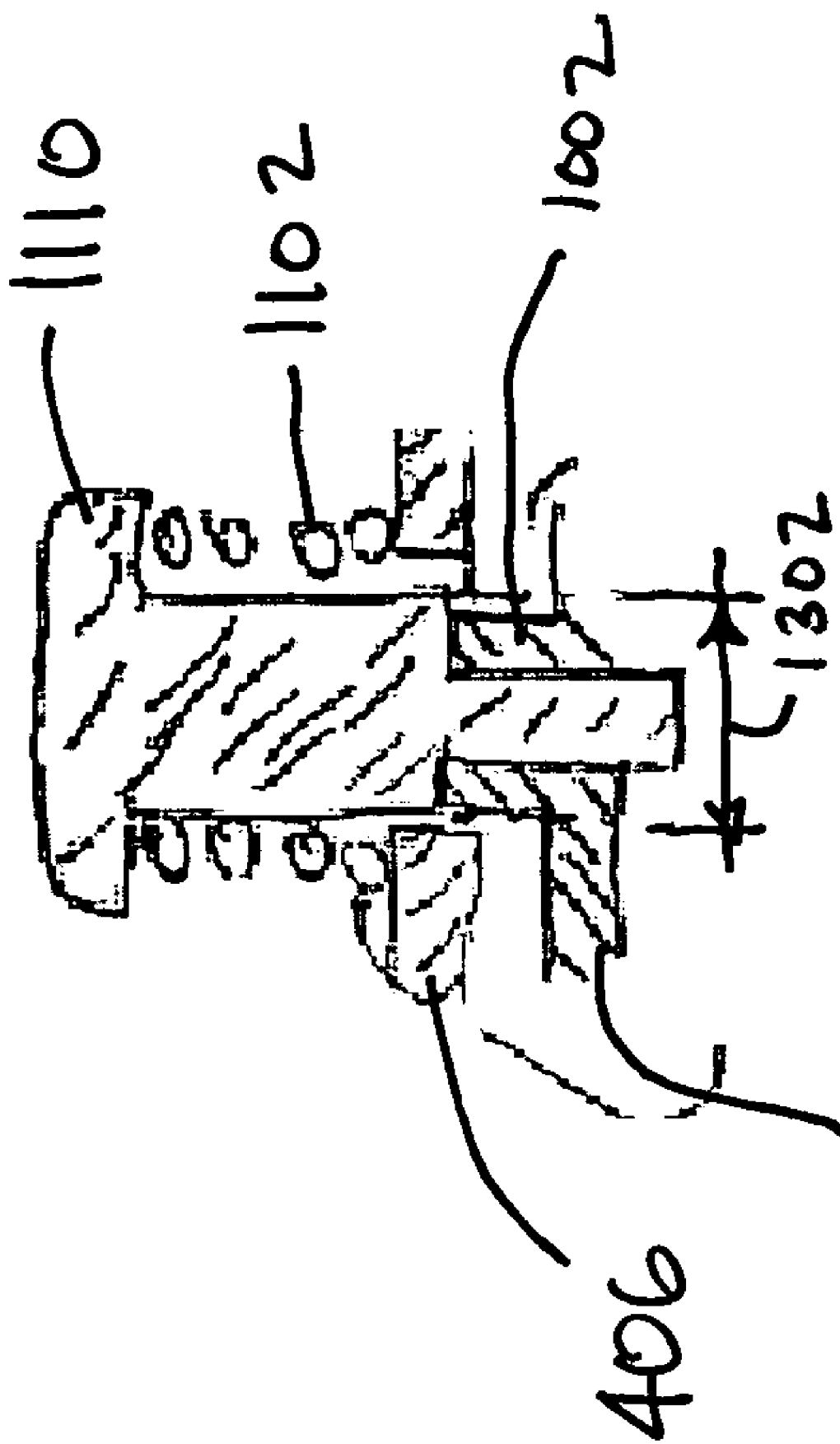
FIG. 13 illustrates a cutaway elevation view of another example of a biasing force device that may be utilized with the assembly of FIG. 4.

The particular structure of the biasing structure 502 illustrated in FIGS. 11 and 12 show an aperture 1118 (as shown in FIG. 11) having a diameter less than a shaft diameter 1120 of the inner shaft 506. Thus, in the example of the shaft 506 comprising a screw, the maximal distance that the heat dissipation structure 406 is allowed to rise above the carrier structure 410 (e.g., the maximum gap 1204 distance as illustrated in FIG. 12) may be set by turning the screw. Alternatively, FIG. 13 illustrates an example where the shaft diameter 1120 is less than the aperture 1118 allowing the heat dissipation structure 406 to pass over the shaft 506 unimpeded. The biasing force device 1102, such as the spring shown in FIG. 13 is of sufficient diameter, however, to ensure that a biasing force is exerted between the cap 1110 and the upper surface 1104 of the heat dissipation structure 406.

Figure 14:
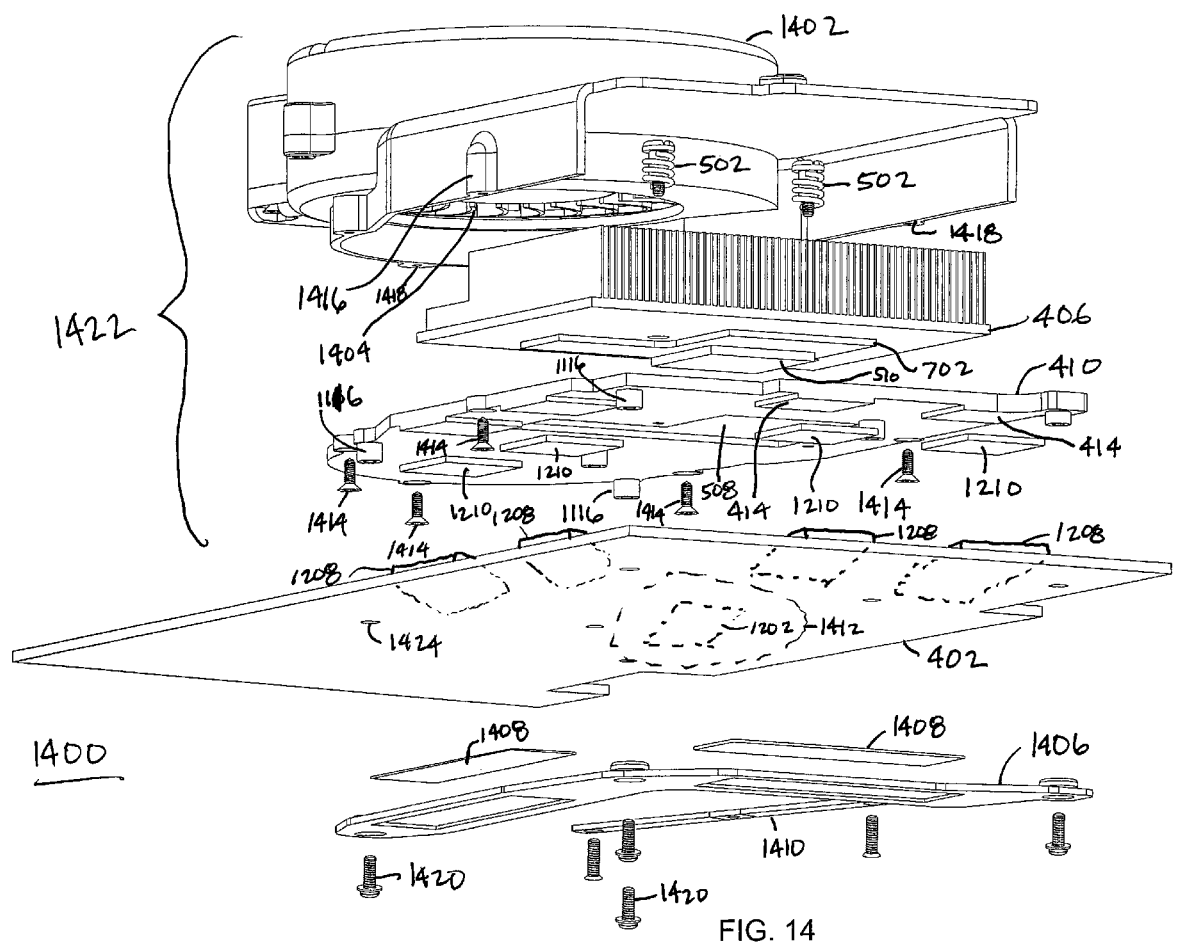
FIG. 14 illustrates a bottom perspective assembly view of an example of a thermal management apparatus according to the present disclosure.

FIG. 14 illustrates an example of an assembly of a circuit assembly 1400 employing the disclosed thermal management device. As illustrated, a circuit substrate 402 includes components such as a digital processor 1202 (shown with dashed lines as the processor is located on the upper side of substrate 402) cooled by the heat dissipation structure 406 as it contacts the processor 1202 with protrusion 510. The illustrated carrier structure 410 is interposed between the heat dissipation structure 406 and the circuit substrate 402 as described previously, the carrier structure 410 includes the aperture 508, which is configured to receive the protrusion 510 in order to contact the processor 1202. The assembly 1400 also includes a housing 1402 including an air mover assembly, such as fan 1404.

After the heat dissipation structure 406 is secured (to the carrier structure 410 by the biasing structures 502), the carrier structure 410 is configured to attach to the housing 1402 with, for example, a series of screws 1414, which engage with a series of holes 1418 in the housing unit 1402. Although screws are shown, any suitable structure or device for affixing the carrier structure 410 to the housing 1402 may be used. Once the carrier 410 is affixed to the housing 1402, this comprises a thermal management unit 1422, which is then affixed to the circuit substrate 402. Affixing the thermal management unit 1422 to the substrate 402 may be accomplished with the assistance of a backplate 406 attached to the bottom of the circuit substrate 402 to provide support. Screws 1420 that pass through holes 1424 in the circuit board and engage with holes within the spacers 1116 secure the upper unit 1422 to the substrate 402. Additionally, underneath the memory devices 1208 on the opposite side of the substrate 402, one or more thermal interfaces 1408 may be utilized to further effect thermal management of the memory devices 1208.

Stresses may occur in an area 1412 of the circuit substrate 402 under the processor 1202 due to the protrusion 510 exerting pressure on the processor 1202. In order to alleviate this stress, a dynamic balancing mechanism 1410 may be mounted to the backside of circuit substrate 402 in the area 1412 in order to apply a force counter to the biasing force in the area 1412. Although the example of FIG. 14 illustrates a V-shaped spring device 1410, any other suitable structure may be utilized that imparts a force to the back surface of the substrate 402 in the area 1412 proximate to the processor 1202. It is also contemplated that rather than the spring device as shown in FIG. 14, the dynamic balancing mechanism could be effected by clips on the upper surface of the substrate 402 that engage with the carrier structure 410 in order to provide rigidity to the area 1412 of the circuit substrate 402, thereby effecting the same result as the spring mechanism illustrated in FIG. 14. Additionally, although the illustrated dynamic balancing mechanism 1410 is a single "bar" shape, the mechanism may be configured in other shapes, such as a "star" shape having three or more prongs extending from a center.

It is further noted that the disclosed apparatus may include a plurality of heat dissipation devices 406 having protrusions 510 that correspond to a plurality of apertures 508 within a carrier structure 410. Thus, for example, rather than the protrusions 414 illustrated, a number of heat dissipation devices 406, corresponding apertures 508, and biasing structures 502 may be used to adjustably provide the requisite pressure for optimal cooling while accommodating varying heights of components being cooled.

Figure 15:
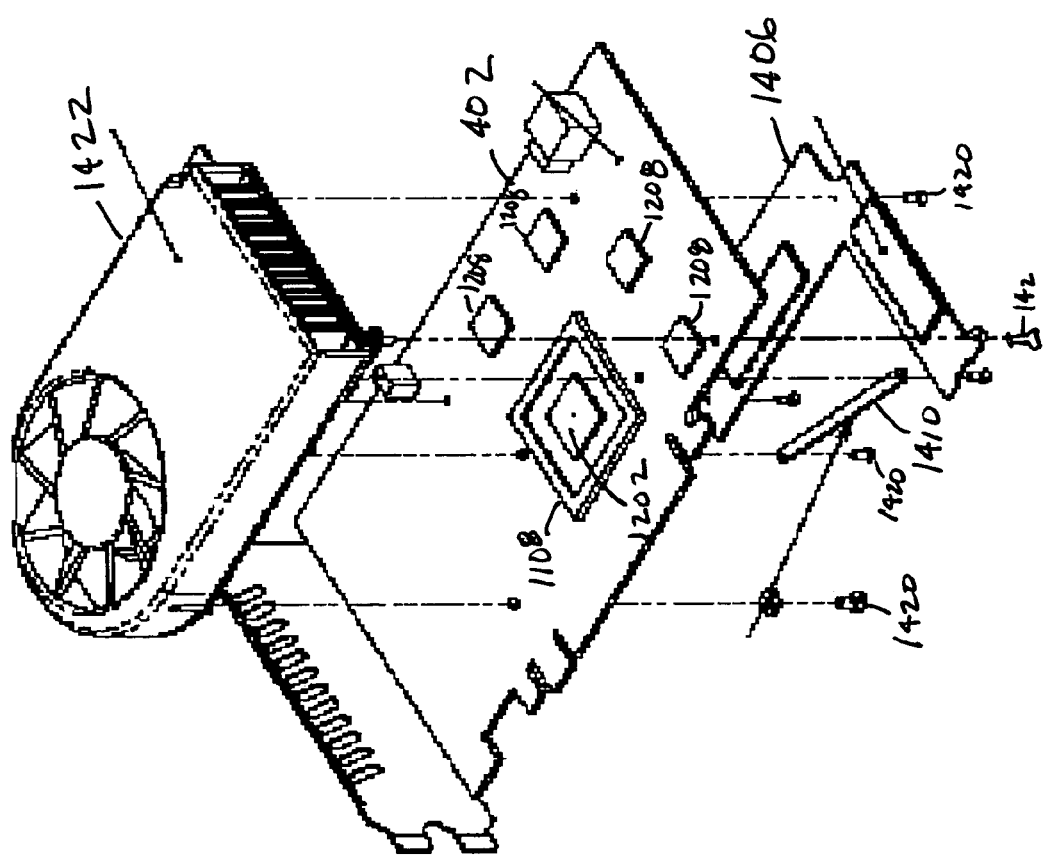
FIG. 15 illustrates a top perspective assembly view of a circuit assembly according to the present disclosure.

FIG. 15 illustrates a top perspective assembly view of a circuit assembly according to the present disclosure. As shown in the figure, a thermal management unit 1422, corresponding to the assembly illustrated in FIG. 14, is shown. This assembly is mounted to the circuit substrate 402 such that it covers the processor 1202, border 1108 and memory devices 1208. In this particular the circuit substrate is part of a graphics card insertable into a PCI or PCI Express bus in a computer. However, it is noted that the illustrated assembly may be any circuit assembly having a substrate with components mounted thereon. Additionally, the dynamic balancing mechanism 1410 is shown to be mounted on the side of the circuit substrate 402 opposite the side where the thermal management unit 1422 is mounted. As explained previously, the thermal management unit 1422 may be mounted with the assistance of a backplate 1406 as shown.

It is noted that although only two biasing structures have been illustrated in the above examples, any number of biasing structures could be employed as desired. For example, four biasing structures could be employed in the heat dissipation apparatus 406 in locations corresponding to each of the four corners of a component on the circuit substrate. This construction allows finer adjustment of the pressure exerted by the protrusion 510 onto the component and more uniformity of pressure across the surface of the component in some cases.

As described, the above-disclosed thermal management device may be used with a circuit substrate including various electrical components having disparate heights, while affording application of various pressures on corresponding components to effect optimal cooling without overstressing of the components. Specifically, by providing a heat dissipation structure with a protrusion and a corresponding carrier structure with an aperture receiving the protrusion, the heat dissipation structure can be engaged with a surface to be thermally managed at a desired pressure applied by the biasing structure, as well as thereby accommodating the particular height of the surface relative to another surface such as a circuit substrate. The employed biasing structure also permits movement of the heat dissipation structure relative to the carrier structure thereby providing a moveable or "floating" heat dissipation structure.

The above detailed description of the examples described herein has been presented for the purposes of illustration and description only and not by limitation. It is therefore contemplated that the present application cover any and all modifications, variations or equivalents that fall within the spirit and scope of the basic underlying principles disclosed above and the appended claims.

What is claimed is:

1. A thermal management apparatus comprising:
    a heat dissipation structure including at least one first protrusion extending from a surface of the heat dissipation structure and adapted to contact a component to be thermally managed;
    a carrier structure including a first side configured to engage with the heat dissipation structure and a second side including at least one second protrusion adapted to contact another component to be thermally managed, the carrier structure defining an aperture that is configured to receive the at least one first protrusion; and
    at least one biasing structure configured to allow movement of the heat dissipation structure relative to the carrier structure and provide a biasing force tending to move the heat dissipation structure and carrier structure together.

2. The thermal management apparatus as defined in claim 1, wherein the at least one biasing structure comprises:
    a shaft having a cap at one end and a fastening mechanism at the other end configured to secure to the carrier structure; and
    a biasing force device disposed between a surface of the heat dissipation structure and the cap to provide to the biasing force.

3. The thermal management apparatus as defined in claim 2, wherein biasing force device includes a spring.

4. The thermal management apparatus as defined in claim 1, wherein the carrier structure is configured to mount to a circuit substrate including electrical components in such a manner that the at least one first protrusion is in thermal contact with at least one component of the electrical components and the thermal management apparatus further includes a dynamic biasing mechanism configured to apply a force counter to the biasing force to the circuit substrate.

5. A thermal management apparatus for a circuit substrate comprising:
    a carrier structure configured to attach to a circuit substrate and defining at least one aperture;
    a heat dissipation structure configured to engage with the carrier structure, the heat dissipation structure including at least one protrusion extending from a surface of the heat dissipation structure that is receivable in the at least one aperture to thermally engage with at least one component on the circuit substrate;

at least one biasing structure configured to allow movement of heat dissipation structure relative to the carrier structure and to provide a biasing force tending to move the heat dissipation structure and carrier structure together such that the at least one protrusion forcibly engages with the at least one component;

wherein the carrier structure further comprises a first side configured to engage with heat dissipation structure and a second side to engage with the circuit substrate, wherein the second side includes at least one second protrusion configured to thermally engage with at least one other component mounted to the circuit substrate; and a dynamic balancing mechanism configured to apply a force to the circuit substrate counter to the biasing force.

6. The thermal management apparatus as defined in claim 5, further comprising an air mover assembly.

7. The thermal management apparatus as defined in claim 5, wherein the at least one biasing structure comprises:

a shaft having a cap at one end and a fastening mechanism at the other end configured to secure to the carrier structure; and a biasing force device disposed between a surface of the heat dissipation structure and the cap to provide to the biasing force.

8. The thermal management apparatus as defined in claim 5, wherein the at least one component and the at least one other component are different heights relative to a surface of the circuit substrate.

9. A circuit assembly comprising:

a substrate including at least one electrical component to be thermally managed;

a carrier structure configured to attach to a first surface of the substrate and defining at least one aperture;

a heat dissipation structure configured to engage with the carrier structure, the heat dissipation structure including at least one protrusion extending from a surface of the heat dissipation structure that is receivable in the at least one aperture to thermally engage with the at least one electrical component mounted on the first surface of the substrate;

at least one biasing structure configured to allow movement of heat dissipation structure relative to the carrier structure and to provide a biasing force tending to move the heat dissipation structure and carrier structure together such that the at least one protrusion forcibly engages with the at least one electrical component;

wherein the carrier structure further comprises a first side configured to engage with the heat dissipation structure and a second side to engage with the circuit substrate, wherein the second side includes at least one second protrusion configured to thermally engage with at least one other component mounted to the circuit substrate; and a dynamic balancing mechanism configured to apply a force to the circuit substrate counter to the biasing force.

10. The circuit assembly as defined in claim 9, wherein the at least one biasing structure comprises:

a shaft having a cap at one end and a fastening mechanism at the other end configured to secure to the carrier structure; and a biasing force device disposed between a surface of the heat dissipation structure and the cap to provide to the biasing force.

11. The circuit assembly as defined in claim 9 wherein the at least one component has a height different from a height of the at least one other component relative to a surface of the circuit substrate.

12. The circuit assembly as defined in claim 9, further comprising an air mover assembly.

13. The circuit assembly as defined in claim 9 including a stepped border surrounding the at least one protrusion and configured to cover a border mounted on the first surface of the substrate and surrounding the at least one electrical component.

* * * * *